(12) United States Patent
Lee

(10) Patent No.: US 7,300,843 B2
(45) Date of Patent: Nov. 27, 2007

(54) METHOD OF FABRICATING FLASH MEMORY DEVICE

(75) Inventor: Seok Kiu Lee, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 398 days.

(21) Appl. No.: 11/160,269

(22) Filed: Jun. 16, 2005

(65) Prior Publication Data

US 2006/0205151 A1    Sep. 14, 2006

(30) Foreign Application Priority Data

Mar. 10, 2005    (KR) ...................... 10-2005-0020238

(51) Int. Cl.
*H01L 21/336* (2006.01)

(52) U.S. Cl. ................ 438/259; 438/596; 257/E21.682

(58) Field of Classification Search ................ 438/259, 438/589, 596; 257/E21.68, E21.682
See application file for complete search history.

(56) References Cited

U.S. PATENT DOCUMENTS 6,159,801 A * 12/2000 Hsieh et al. ................ 438/259

6,403,421 B1 * 6/2002 Ikeda et al. ................. 438/267

FOREIGN PATENT DOCUMENTS

KR    2001-3086    1/2001

\* cited by examiner

*Primary Examiner*—Chandra Chaudhari
(74) *Attorney, Agent, or Firm*—Marshall, Gerstein & Borun LLP

(57) ABSTRACT

A method of fabricating a flash memory device is disclosed wherein, electrode spacers are formed on sides of self-aligned floating gates having a negative slope. Thus, upon etching of a stack gate after an interlayer dielectric film and a control gate are formed, a stringer of a control gate, which is formed by the negative slope of the self-aligned floating gates, can be prevented. Furthermore, because an isotropic etch process is used to remove element isolation films between the floating gates, the element isolation films do not remain on the sides of the floating gates. It is thus possible to prevent loss of the coupling ratio. Accordingly, failure of devices can be reduced and decreasing the program speed can be prevented.

23 Claims, 3 Drawing Sheets

METHOD OF FABRICATING FLASH MEMORY DEVICE

CROSS REFERENCE TO RELATED APPLICATIONS

This application relies for priority upon Korean Patent Application No. 2005-20238 filed on Mar. 10, 2005, the contents of which are herein incorporated by reference in their entirety.

FIELD OF THE INVENTION

The present patent relates to a method of fabricating a flash memory device, and more specifically, to a method of fabricating a flash memory device, wherein the capacitance of an interlayer dielectric film can be secured without loss while preventing formation of a stringer of a control gate.

DISCUSSION OF RELATED ART

Generally, semiconductor memory devices are largely classified into a volatile memory and a non-volatile memory.

Volatile memory includes RAMs such as DRAM (Dynamic Random Access Memory) and SRAM (Static Random Access Memory). The volatile memory has characteristics in which it can maintain data when being powered, but cannot maintain data when not being powered.

In DRAM, transistors have a switch function, and capacitors have a data storage function. If not being powered, data within the DRAM is automatically lost. Further, SRAM has a transistor structure of a flip flop type, and stores data depending upon a difference in the degree of driving between transistors. In SRAM, data are also automatically lost if not being powered.

In contrast, the non-volatile memory in which stored information is not lost when not being powered was developed in order to program data relating to the management of a system or an operating system.

The non-volatile memory includes EPROM (Electrically Programmable Read Only Memory), EEPROM (Electrically Erasable and Programmable Read Only Memory), flash memory, and the like, which are all commercialized. More particularly, a NAND type flash memory has recently been spotlighted along with explosive growth of mobile communication devices, MP3s, digital cameras, and the like.

The flash memory cell generally has a structure in which a tunnel dielectric film, a floating gate, an interlayer dielectric film and a control gate are formed on a silicon substrate. In the flash memory cell having this structure, data can be stored by injecting or extracting electrons into or from the floating gate through application of a proper voltage to a control gate and a substrate.

In such a flash memory device, if the design rule drops below 70 nm, the accuracy that is actually required becomes lower than the limit of overlay accuracy of lithography equipment. Thus, the flash memory device inevitably adopts a self-aligned floating gate (hereinafter, referred to as "SAFG") in which a floating gate is formed on element isolation trenches, which are already formed in a substrate, by means of self-aligned mode.

The SAFG structure is fabricated in such a manner that trenches are formed in a semiconductor substrate having a pad oxide film and a silicon nitride film formed in, the trenches are buried to form element isolation films, the silicon nitride film and the pad oxide film are wet etched, tunnel dielectric films are intervened into the portions in which the silicon nitride film and the pad oxide film are wet-etched, and a floating gate is then formed.

In the process of removing the silicon nitride film and the pad oxide film through wet etch, the element isolation films are also partially etched, thus having a positive slope. The floating gate thus has a negative slope.

In a state where the floating gate has the negative slope as such, the height of the element isolation films is lowered by means of a wet etch method. After an interlayer dielectric film and a control gate are formed, a stack gate in which the floating gate and the control gate are stacked is etched. Upon etching of the stack gate, however, a stringer is inevitably formed in which neighboring control gates are connected because the control gates remain due to a shadowing effect by the floating gate having the negative slope.

In order to solve this stringer problem of the control gate, if anisotropic dry etch is performed without wet-etching the element isolation films, however, the element isolation films thickly remain on sidewalls of the floating gate having the negative slope. This reduces the capacitance of the interlayer dielectric film. Therefore, there is a problem in that the coupling ratio is lowered.

In this case, the ability in which a voltage applied to the control gate is transferred to the floating gate is lowered, resulting in a reduction in the program speed. In order to compensate for a reduction of the program speed, a method in which an externally applied voltage is increased that much is desirable. In this case, there is a need for design of products and transistors that can withstand a high voltage. This can increase the load accordingly.

SUMMARY OF THE INVENTION

Accordingly, the present patent addresses the above problems, and it is an object of the present patent to disclose a method of fabricating a flash memory device, wherein the capacitance of an interlayer dielectric film can be secured without loss, while preventing a stringer of a control gate from being formed.

The patent also discloses a method of fabricating a flash memory device, in which the program speed can be enhanced.

To accomplish this, there is provided a method of fabricating a flash memory device, including the steps of (a) forming a pad insulating film and a hard mask film on a semiconductor substrate, (b) selectively removing the hard mask film, the pad insulating film and the semiconductor substrate to form trenches, (c) forming element isolation films within the trenches, (d) removing the hard mask film and the pad insulating film by means of an isotropic etch process, (e) forming floating gates between the element isolation films with tunnel insulating films therebetween, (f) removing the element isolation films to a predetermined thickness by means of an isotropic etch process, (g) forming electrode spacers on the sides of the floating gates, which are exposed through the removal of the element isolation films, and (h) forming a control gate on the entire surface with the interlayer dielectric film therebetween.

The pad insulating film is preferably formed using an oxide film.

The hard mask film is preferably formed using a silicon nitride film.

The pad insulating film can be formed to a thickness of 20 to 200 Å.

The hard mask film can be formed to a thickness of 300 to 3000 Å.

In the step (d), the hard mask film is preferably removed by means of a wet etch process using a phosphoric acid solution.

In the step (d), the sides of the element isolation films are also etched whereby the element isolation films have a positive slope.

The floating gates preferably have a negative slope.

The floating gates can be formed by depositing a material for the floating gates on the entire surface, and polishing the material for floating gates so that the element isolation films are exposed.

The material for floating gates is preferably a polysilicon film.

When removing the element isolation films in the step (f), the process can be controlled so that the surface of the element isolation films does not becomes lower than the floating gates.

When removing the element isolation films in the step (f), an etching solution containing fluoric acid (HF) is preferably used.

The electrode spacers can be formed using the same material as that of the floating gates such as, for example, a polysilicon film.

The step (g) may include the steps of forming an electrode film on the entire surface, and etching the electrode film by means of an anisotropic blanket etch process to form electrode spacers on the sides of the floating gates, which are exposed through the removal of the element isolation films.

The method can further include the step of selectively patterning the control gate, the interlayer dielectric film and the floating gates after the step (h).

A hard mask pattern can be formed on a predetermined region of the control gate, and the control gate, the interlayer dielectric film and the floating gates are selectively etched using the hard mask pattern as a mask.

The hard mask pattern can be one of a silicon oxide film, a silicon nitride film, a silicon oxynitride film and amorphous carbon.

The interlayer dielectric film can be formed using an ONO (Oxide-Nitride-Oxide) film.

The oxide film in the ONO film can be formed by means of a thermal oxidization method or a CVD method.

The nitride film in the ONO film can be formed by means of a CVD method.

In the ONO film, the first oxide film is preferably formed to a thickness of 30 to 150 Å the nitride film is formed to a thickness of 30 to 150 Å, and the second oxide film is formed to a thickness of 30 to 150 Å.

The control gate can be formed using one of polysilicon, tungsten (W) and tungsten silicide ($WSi_2$), or a combination of them.

DETAILED DESCRIPTION OF VARIOUS EMBODIMENTS

Various embodiments will be described with reference to the accompanying drawings. Those of ordinary skill in the art will appreciate that the disclosed embodiments may be modified in various manners and the scope of the present patent is not limited by the embodiments described later.

FIGS. 1a to 1e are cross-sectional view illustrating process steps in an exemplary method of fabricating a flash memory device.

Figure 1A:
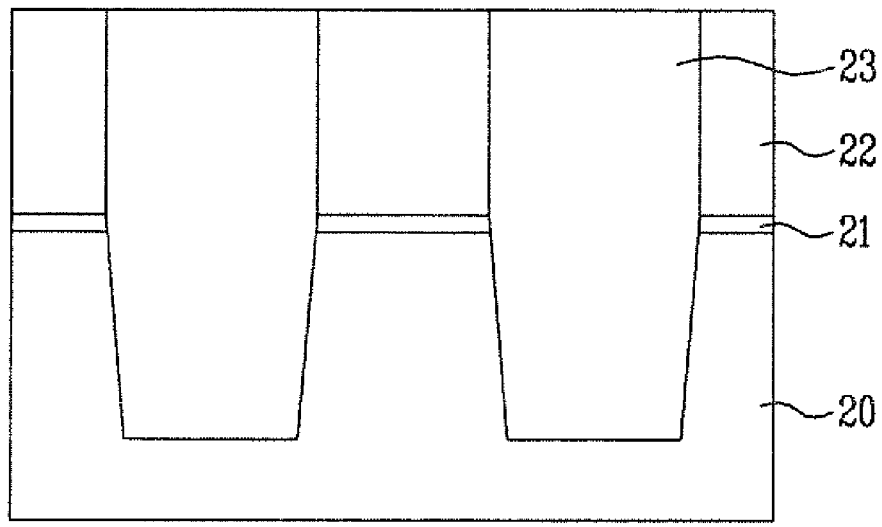
FIGS. 1a to 1e are cross-sectional views illustrating process steps in an exemplary method of fabricating a flash memory device.

In the method of fabricating the flash memory device according to the disclosed embodiment of the present patent, a pad insulating film 21 and a hard mask film 22 are first sequentially formed on a semiconductor substrate 20, as shown in FIG. 1a.

The pad insulating film 21 can be formed to a thickness of 20 to 200 Å using an oxide film, and the hard mask film 22 can be formed to a thickness of 300 to 3000 Å using a silicon nitride film.

The hard mask film 22 and the pad insulating film 21 are selectively removed by means of a photolithography process. The semiconductor substrate 20, which is exposed through the removal of the pad insulating film 21, is etched to a predetermined depth, thus forming trenches.

An oxide film is then deposited to gap fill the trenches. The oxide film undergoes chemical mechanical polishing (hereinafter, referred to as "CMP") so that the hard mask film 22 is exposed, thus forming element isolation films 23.

Figure 1B:
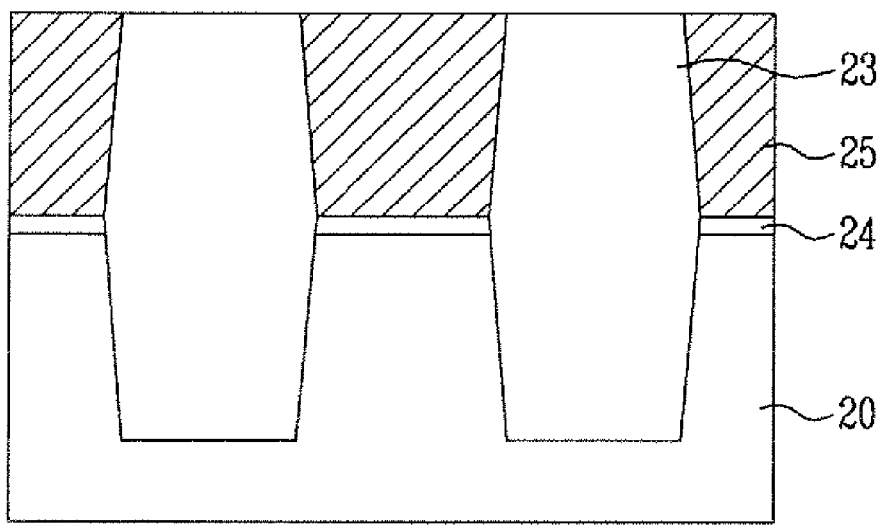

Referring to FIG. 1b, the hard mask film 22 and the pad insulating film 21 are removed by means of a wet etch process. Upon wet-etching of the hard mask film 22, an etch solution can employ a phosphoric acid solution.

The sides of the element isolation films 23 are eroded by means of the etch solution used in the wet etch process, so that the element isolation films 23 have a positive slope.

Thereafter, tunnel dielectric films 24 are formed on the surface of the semiconductor substrate 20, which is exposed through the removal of the pad insulating film 21. After a polysilicon film for a floating gate is deposited to fill between neighboring element isolation films 23, the polysilicon film for the floating gate undergoes a CMP process, thus forming floating gates 25 that are formed between the element isolation films 23 in a self-aligned manner.

The floating gates 25 that are formed in the self-aligned manner share an interface with the element isolation films 23. The floating gates 25 have a negative slope in contrast to the element isolation films 23.

Figure 1C:
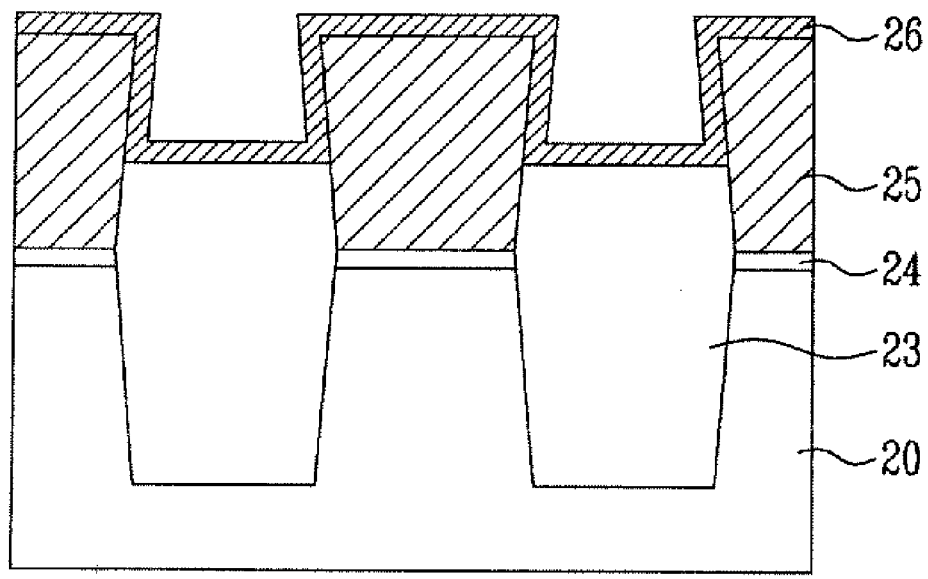

Referring to FIG. 1c, the height of the element isolation films 23 between the floating gates 25 is lowered by means of a wet etch process using an etching solution containing fluoric acid (HF).

Thereafter, in order to prevent formation of a stringer due to the negative slope of the floating gates 25 exposed by the wet etch, an electrode film 26 is formed on the entire surface.

The electrode film 26 can be formed using the same material as that of the floating gates 25, i.e., a polysilicon film.

Figure 1D:
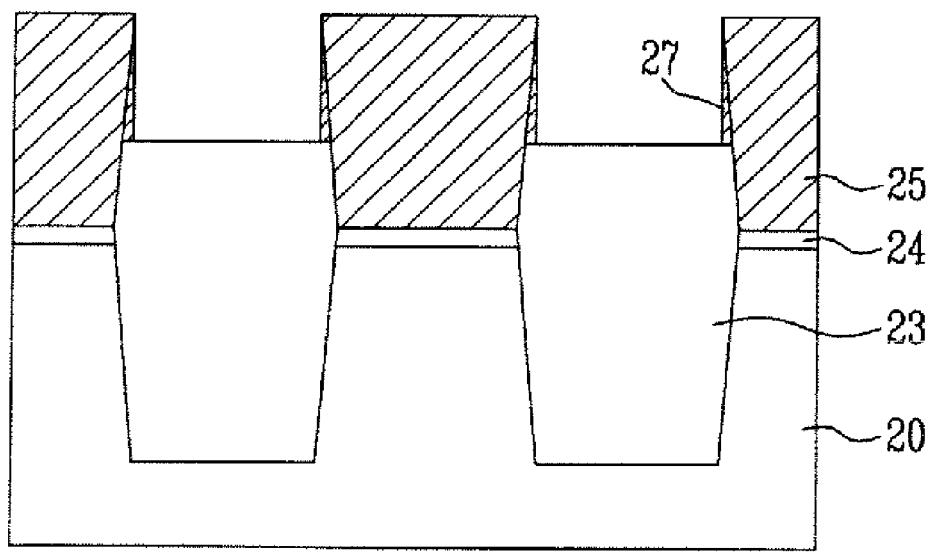

Referring next to FIG. 1d, the electrode film 26 undergoes blanket etch in an anisotropic manner, thereby forming the electrode spacers 27 on both sides of the floating gates 25.

Therefore, the electrode spacers 27 are formed at the sides of the floating gates 25 that had the negative slope. The negative slopes of the floating gates 25 are compensated for by the electrode spacers 27 and are thus not exposed.

Figure 1E:
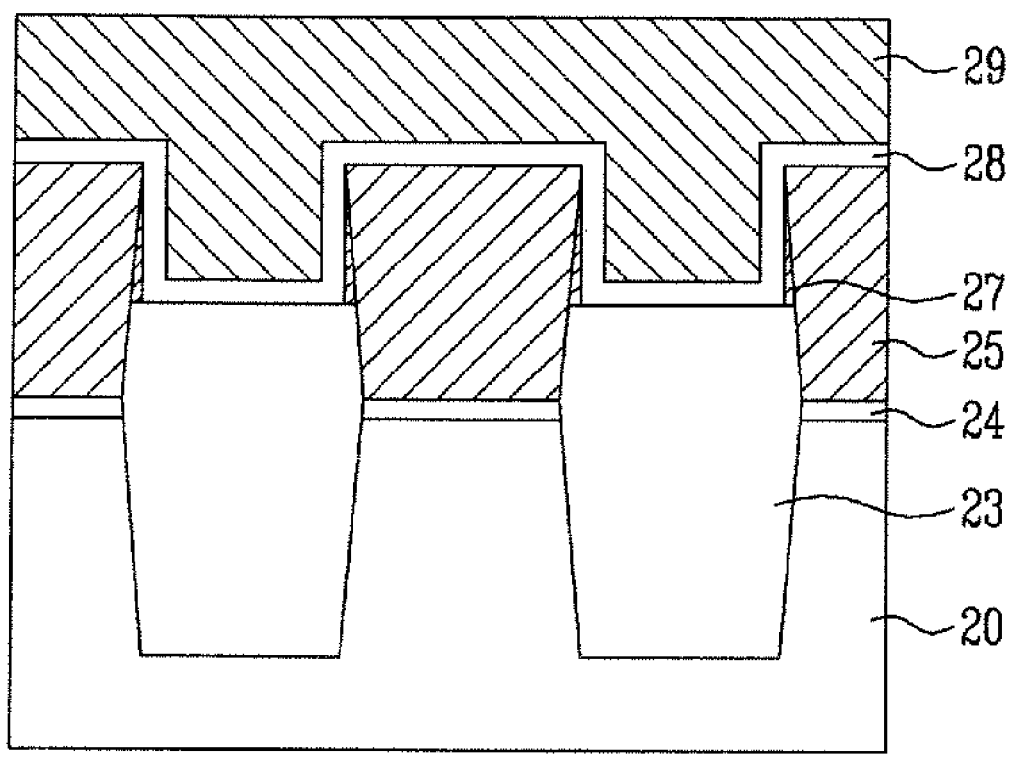

Thereafter, as shown in FIG. 1e, an interlayer dielectric film 28 is formed on the entire surface, and a control gate 29 is formed on the interlayer dielectric film 28.

A material constituting the control gate 29 may employ polysilicon, a metal such as tungsten (W) or tungsten silicide ($WSi_2$), or a combination of them.

Further, the interlayer dielectric film 28 can preferably use an ONO film formed by stacking an oxide film having a thickness of 30 to 150 Å, which is formed by means of thermal oxidization or a chemical vapor deposition (hereinafter, referred to as "CVD") method, a nitride film of 30 to 150 Å in thickness, which is formed by means of a CVD method, and an oxide film having a thickness of 30 to 150 Å, which is formed by means of thermal oxidization or CVD method. However, the interlayer dielectric film 28 can employ a dielectric film having a high dielectric constant instead of the ONO film.

Because the electrode spacers 27, and not the element isolation film, are formed on the sidewalls of the floating gates 25 having the negative slope, it is possible to secure the capacitance of the interlayer dielectric film 28 without loss. It is thus possible to prevent the coupling ratio from decreasing.

Though not shown in the drawings, the control gate 29, the interlayer dielectric film 28 and the floating gates 25 are selectively patterned by means of a common patterning process, thereby completing a gate of the flash memory device.

Though not shown in the drawings, in order to facilitate the gate patterning process, a method in which a hard mask pattern is formed on a predetermined region of the control gate 29, and the control gate 29, the interlayer dielectric film 28 and the floating gates 25 are patterned using the hard mask pattern as a mask can be used.

The hard mask pattern can employ one of a silicon oxide film, a silicon nitride film, a silicon oxynitride film and amorphous carbon.

Fabrication of the flash memory device according to an embodiment of the present invention is thereby completed.

As described above, in a structure of self-aligned floating gates, electrode spacers are formed on sidewalls of the floating gates having a negative slope. It is thus possible to prevent formation of a stringer of a control gate when a subsequent stack gate pattern is etched. Accordingly, the production yield can be improved because failure of devices are prevented.

Furthermore, because element isolation films do not remain on the sides of floating gates, the capacitance of an interlayer dielectric film can be secured without loss. It is thus possible to prevent the coupling ratio from decreasing. Accordingly, although a voltage, which has to be generated in a high voltage circuit that generates a voltage for driving a flash memory device, is lowered, the program speed can be maintained. This results in the ability to fabricate flash memory devices in a reliable manner.

Although the foregoing description has been made with reference to the various embodiments, it is to be understood that changes and modifications of the present invention may be made by the ordinary skilled in the art without departing from the spirit and scope of the present invention and appended claims.

What is claimed as new and desired to be protected by Letters Patent of the United States is:

1. A method of fabricating a flash memory device, comprising the steps of:
   (a) forming a pad insulating film and a hard mask film on a semiconductor substrate;
   (b) selectively removing the hard mask film, the pad insulating film and the semiconductor substrate to form trenches;
   (c) forming element isolation films within the trenches;
   (d) removing the hard mask film and the pad insulating film by means of an isotropic etch process;
   (e) forming floating gates between the element isolation films with tunnel insulating films therebetween;
   (f) removing the element isolation films to a predetermined thickness by means of an isotropic etch process;
   (g) forming electrode spacers on the sides of the floating gates, which are exposed through the removal of the element isolation films; and
   (h) forming a control gate on the entire surface with the interlayer dielectric film therebetween.

2. The method as claimed in claim 1, wherein the pad insulating film is formed using an oxide film.

3. The method as claimed in claim 1, wherein the hard mask film is formed using a silicon nitride film.

4. The method as claimed in claim 1, wherein the pad insulating film is formed to a thickness of 20 to 200 Å.

5. The method as claimed in claim 1, wherein the hard mask film is formed to a thickness of 300 to 3000 Å.

6. The method as claimed in claim 1, wherein in the step (d), the hard mask film is removed by means of a wet etch process using a phosphoric acid solution.

7. The method as claimed in claim 1, wherein in the step (d), the sides of the element isolation films are also etched so that the element isolation films have a positive slope.

8. The method as claimed in claim 1, wherein the floating gates have a negative slope.

9. The method as claimed in claim 1, wherein the floating gates are formed by depositing a material for the floating gates on the entire surface, and polishing the material for the floating gates so that the element isolation films are exposed.

10. The method as claimed in claim 9, wherein the material for the floating gates is a polysilicon film.

11. The method as claimed in claim 1, wherein when removing the element isolation films in the step (f), the process is controlled so that the surface of the element isolation films does not becomes lower than the floating gates.

12. The method as claimed in claim 1, wherein when removing the element isolation films in the step (f), an etching solution containing fluoric acid (HF) is used.

13. The method as claimed in claim 1, wherein the electrode spacers are formed using the same material as that of the floating gates.

14. The method as claimed in claim 13, wherein the electrode spacers are formed using a polysilicon film.

15. The method as claimed in claim 1, wherein the step (g) includes the steps of:
   forming an electrode film on the entire surface; and
   etching the electrode film by means of an anisotropic blanket etch process to form electrode spacers on the sides of the floating gates, which are exposed through the removal of the element isolation films.

16. The method as claimed in claim 1, further including the step of selectively patterning the control gate, the interlayer dielectric film and the floating gates after the step (h).

17. The method as claimed in claim 16, wherein a hard mask pattern is formed on a predetermined region of the control gate, and the control gate, the interlayer dielectric film, and the floating gates are selectively etched using the hard mask pattern as a mask.

18. The method as claimed in claim 17, wherein the hard mask pattern is one of a silicon oxide film, a silicon nitride film, a silicon oxynitride film and amorphous carbon.

19. The method as claimed in claim 1, wherein the interlayer dielectric film is formed using an ONO (Oxide-Nitride-Oxide) film.

20. The method as claimed in claim 19, wherein the oxide film in the ONO film is formed by means of a thermal oxidization method or a chemical vapor deposition method.

21. The method as claimed in claim 19, wherein the nitride film in the ONO film is formed by means of a chemical vapor deposition method.

22. The method as claimed in claim 19, wherein in the ONO film, the first oxide film is formed to a thickness of 30 to 150 Å, the nitride film is formed to a thickness of 30 to 150 Å, and the second oxide film is formed to a thickness of 30 to 150 Å.

23. The method as claimed in claim 1, wherein the control gate is formed using one of polysilicon, tungsten (W) and tungsten silicide ($WSi_2$), or a combination of them.

* * * * *

UNITED STATES PATENT AND TRADEMARK OFFICE
CERTIFICATE OF CORRECTION

| | | |
|---|---|---|
| PATENT NO. | : 7,300,843 B2 | Page 1 of 1 |
| APPLICATION NO. | : 11/160269 | |
| DATED | : November 27, 2007 | |
| INVENTOR(S) | : Seok Kiu Lee | |

It is certified that error appears in the above-identified patent and that said Letters Patent is hereby corrected as shown below:

In the Claims:

At Column 6, line 31, "becomes" should be -- become --.

Signed and Sealed this

Second Day of September, 2008

JON W. DUDAS
*Director of the United States Patent and Trademark Office*